(12) United States Patent
Maddux (10) Patent No.: US 7,349,507 B2
(45) Date of Patent: Mar. 25, 2008

(54) EXTENDING PPM TOLERANCE USING A TRACKING DATA RECOVERY ALGORITHM IN A DATA RECOVERY CIRCUIT

(75) Inventor: John T. Maddux, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 783 days.

(21) Appl. No.: 10/458,030

(22) Filed: Jun. 9, 2003

(65) Prior Publication Data

US 2004/0247049 A1 Dec. 9, 2004

(51) Int. Cl.
*H04L 7/00* (2006.01)
(52) U.S. Cl. .................................... 375/355; 375/371
(58) Field of Classification Search ........ 375/354–355, 375/371, 376, 259; 327/141, 291
See application file for complete search history.

(56) References Cited

U.S. PATENT DOCUMENTS

| 4,039,748 | A | * | 8/1977 | Caron et al. ................ 375/355 |
|---|---|---|---|---|
| 4,833,474 | A | * | 5/1989 | Nagai et al. ................ 341/166 |
| 4,878,229 | A | * | 10/1989 | Szechenyi .................... 375/232 |
| 4,890,299 | A | * | 12/1989 | Dolivo et al. ............... 375/290 |
| 5,778,032 | A | * | 7/1998 | Tanaka et al. ............... 375/355 |
| 6,028,902 | A | * | 2/2000 | Kiyanagi et al. ............ 375/355 |
| 6,735,259 | B1 | * | 5/2004 | Roberts et al. .............. 375/316 |
| 6,847,693 | B1 | * | 1/2005 | Strait ........................ 375/355 |
| 6,914,945 | B2 | * | 7/2005 | Kato et al. .................. 375/326 |
| 7,076,377 | B2 | * | 7/2006 | Kim et al. .................... 702/66 |
| 2003/0086339 | A1 | * | 5/2003 | Dally et al. ................. 368/202 |
| 2004/0158420 | A1 | * | 8/2004 | Kim et al. .................... 702/66 |
| 2004/0208270 | A1 | * | 10/2004 | Schmatz et al. ............. 375/355 |
| 2004/0213351 | A1 | * | 10/2004 | Shattil ........................ 375/260 |
| 2006/0224339 | A1 | * | 10/2006 | Kim et al. .................... 702/66 |

\* cited by examiner

*Primary Examiner*—Jean B. Corrielus
(74) *Attorney, Agent, or Firm*—David P. McAbee (57) ABSTRACT

A circuit comprising a sampling logic to sample an incoming signal. A phase detection logic to determine a phase error associated with the sample of the incoming signal and to output an out-of-phase detection signal based on the phase error. A control logic coupled to the phase detection logic to output a periodic error signal at a periodic rate. A phase adjustment logic to adjust the phase of the sampling logic based on the out-of-phase detection signal and the periodic error signal.

37 Claims, 7 Drawing Sheets

| Current Direction | First Error Signal | Control Outputs | Effect on Timer |
|---|---|---|---|
| Advance | Advance | Tdn = 1 | Trips more frequently |
| Advance | Retard | Tup = 1 | Trips less frequently |
| Advance | Neither | Neither | None |
| Retard | Retard | Tdn = 1 | Trips more frequently |
| Retard | Advance | Tup = 1 | Trips less frequently |
| Retard | Neither | Neither | None |
| Neither | Advance | Tdn = 1 current direction = Advance | Trips more frequently |
| Neither | Retard | Tup = 1, current direction = Retard | Trips less frequently |
| Neither | Neither | Neither | None |

FIG. 7

| | First Error Signal | Timeout Value | Timer Value | Direction | Generate Second Error Signal |
|---|---|---|---|---|---|
| 860 | Default | Large Default | N/A | N/A | N/A |
| 865 | Advance | 32 | count from 0 to 32 | Advance | Generate Advance on count 32 |
| 870 | Advance | 31 | count from 0 to 31 | Advance | Generate Advance on count 31 |
| 875 | Advance | 30 | count from 0 to 30 | Advance | Generate Advance on count 30 |
| 880 | Advance | 29 | count from 0 to 29 | Advance | Generate Advance on count 29 |
| 885 | Retard | 30 | count from 0 to 30 | Advance | Generate Retard on count 30 |

EXTENDING PPM TOLERANCE USING A TRACKING DATA RECOVERY ALGORITHM IN A DATA RECOVERY CIRCUIT

FIELD

This disclosure relates to the field of clock recovery in a tracking receiver and, in particular, to extending the parts-per million (PPM) tolerance of phase interpolators used in data recovery circuits.

BACKGROUND

Figure 1:
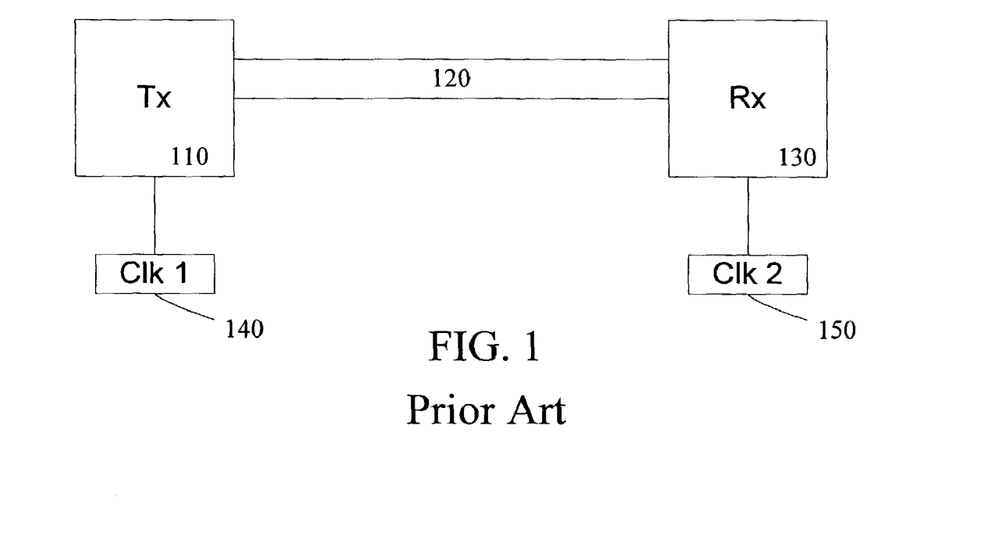
FIG. 1 illustrates a prior art transmitter and tracking receiver with independent clock sources coupled together by an interconnect/bus.

In many data communication architectures a clock signal is not transmitted with the data, requiring a receiver to have the ability to recover the clock signal from the transmitted data. For example, in FIG. 1, transmitting device 110 has a first clock reference 140 that it transmits data based on, while receiver 130, has a separate clock reference 150. Since no clock signal is transmitted over bus 120, receiver 130 must recover the clock signal from the transmitted data.

Prior art requires the use of data recovery circuits to recover the clock from serial data streams in devices called tracking receivers. Various tracking architectures have been used for this purpose. For example, many loop architectures including phase locked loop (PLL) based and delay locked loop (DLL) based architectures have been used. These circuits have various disadvantages. A PLL includes an oscillator that injects noise into the surrounding system. Furthermore, a PLL typically uses a voltage level to control its oscillation frequency, which is prone to frequency distortions introduced through low levels of noise on the control lines. A PLL also includes an analog loop filter to dampen input noise, which typically is an RC time constant network that consumes a relatively large amount of on-die area. DLL based architectures are also prone to frequency distortion and utilize analog filters which consume a relatively large on-die area. In addition, a DLL has a finite delay range.

Current clock recovery circuits have begun to use digital phase interpolation to overcome the aforementioned disadvantages. These digital phase interpolation circuits are known as phase interpolators. A specific implementation of a phase interpolator can be found in the patent application with Ser. No. 09/891,466, now U.S. Pat. No. 6,943,606. Typical phase interpolator loops determine if an actual sample of data is earlier or later than an ideal sampling point. From this determination, an out-of-phase detection signal, which can represent an advance or retard signal, is digitally filtered. To minimize unwanted phase adjustments due to noise injected on the incoming data stream, it is preferable to keep the digital filter fairly deep.

However, current phase interpolators cannot adequately filter larger PPM errors. When larger PPM errors are introduced the phase interpolator must step the clock used to sample the incoming signal much faster to make up for the larger PPM error. Unfortunately, when the rate of adjustment is increased the amount of digital filtering that may be done decreases. In some cases, where a relatively large PPM error, such as 5000 PPM, is introduced, there is almost no digital filtering. Without filtering, the result would be a receiver with an unacceptable high sensitivity to jitter on the incoming data stream, which would lead to incorrect phase adjustments and errors in the system.

BRIEF DESCRIPTION OF THE DRAWINGS

The present invention is illustrated by way of example and not intended to be limited by the figures of the accompanying drawings.

DETAILED DESCRIPTION

In the following description, numerous specific details are set forth such as exact implementation of functional blocks in order to provide a thorough understanding of the present invention. It will be apparent, however, to one skilled in the art that these specific details need not be employed to practice the present invention. In other instances, well known components or methods have not been described in detail in order to avoid unnecessarily obscuring the present invention.

Some methods and apparatuses described herein are for extending the PPM tolerance of data recovery circuits (DRCs). As an illustrative example, a DRC may be a loop architecture, such as a phase interpolator.

Figure 2:
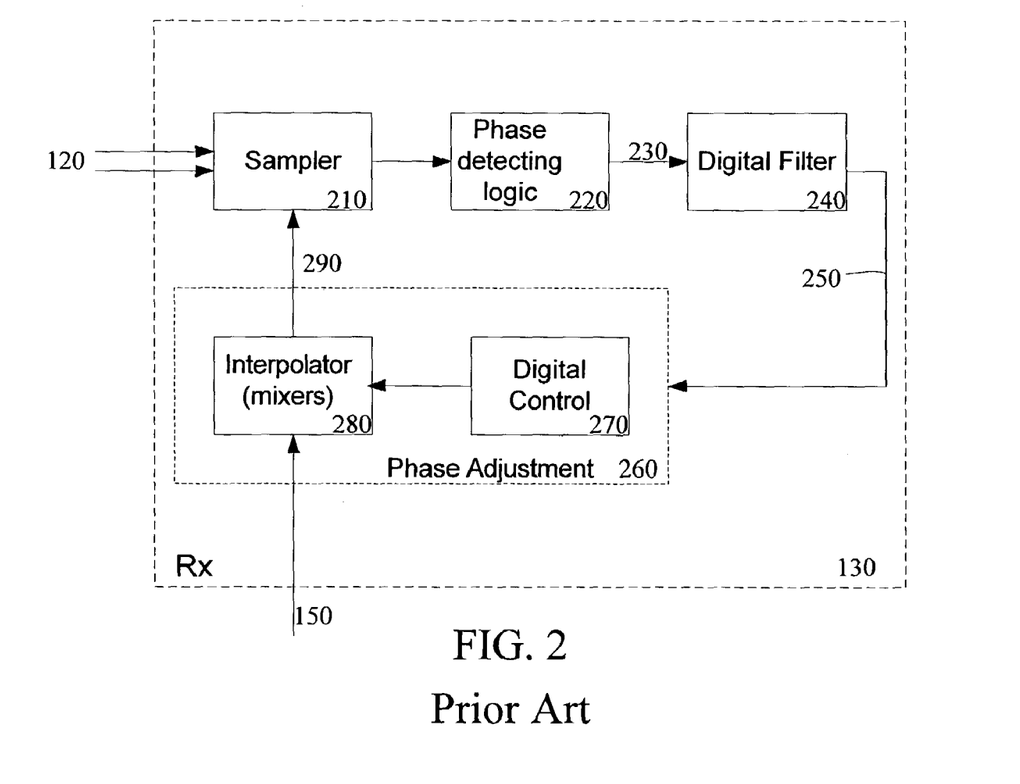
FIG. 2 illustrates a functional block diagram of a prior art phase interpolator within the tracking receiver of FIG. 1.

FIG. 2 illustrates an example of a phase interpolator within tracking receiver 130. Sampler 210 samples incoming serial data 120. Sampler 210 may take a single sample or a plurality of samples within one period of data. For example, sampler 210 may sample serial data 120 with four clocks in quadrature (90 degrees out of phase) to each other. Ordinary latches, clocks, and gates may be used to implement sampler 210.

Phase detection logic 220 then uses these samples to determine if an ideal sampling point for this data period is earlier (need to retard the sampler clock) or later (need to advance the sampler clock) than the current location of the sampler clock 290. Phase detection logic 220 may be realized using ordinary comparators, registers, and gates. Phase detection logic 220 then outputs an out-of-phase detection signal 230, which may represent an advance or retard signal. Out-of-phase detection signal 230 is then filtered digitally by digital filter 240.

Digital filter 240 is typically fairly deep to minimize unwanted phase adjustments due to jitter in incoming serial signal 120. For example, digital filter 240 could have a depth of 32, which would require 32 more out-of-phase detection signals representing an advance than representing a retard, or vice-versa, to output an error signal 250. Digital Filter 240 may be any ordinary digital filter. For example digital filter 240 may be a low pass filter. Error signal 250 may represent either an advance signal, a retard signal, or neither, which triggers phase adjustment in the correct direction. Phase adjustment block 260 comprises interpolators/mixers 280 and digital control 270, to take a single or a plurality of input clocks 150, as well as error signal 250, and adjust the phase of sampler 210 by adjusting the phase of at least one sampling clock 290 to be closer to the ideal sampling point. It is apparent that sampling clock 290 may be a plurality of clocks that are phase adjusted to be closer to ideal sampling points. Depending on the optimal choice for the specific implementation, phase adjustment logic 260 may operate at a slower speed than the maximum theoretical data rate. For example, phase adjustment logic 260 may operate at half or one-fourth the speed of the maximum data rate.

In these data recovery circuits it is desirable to keep the digital filtering fairly deep to reduce improper phase adjustments. However, when a relatively large PPM error is introduced between transmitter 110 and the loop in tracking receiver 130 including sampler 210, phase detecting logic 220, digital filter 240, and phase adjustment logic 260 amount of digital filtering applied to the incoming signal is reduced so that the tracking receiver 130 can track the frequency difference. PPM error between transmitter 110 and the loop in tracking receiver 130 may be introduced in a variety of ways. For example, clock sources 140 and 150 may be separate clock crystals which introduce PPM error in the system. When filtering is reduced the receiver becomes unacceptably sensitive to jitter on the incoming signal, which leads to incorrect phase adjustments.

For example, the depth of a digital filter may be 32, which would require 32 more determinations that an advance rather than a retard in the sampling clock is needed. This would filter out any jitter (incorrect advance or retard signals based off noise in the incoming signal), by requiring numerous advance or retard signals before the sampling clock is adjusted.

When a transmitting device is running at a slightly different frequency than the receiving device, phase adjustments are made at a regular periodic rate to account for the frequency difference. The rate of these adjustments is a function of the clock parts per million (PPM) offset allowed and the number of steps to cover in one unit interval (UI). The generalized formula to calculate the rate of steps required to make up for a PPM offset is as follows:

$$Rate = \frac{1 + \frac{PPM_{Error}}{10e^6}}{\frac{Steps * PPM_{Error}}{10e^6}},$$

where $PPM_{Error}$ is the offset between clock rates of the transmitter and receiver in parts-per-million and Steps is the number of steps to cover the full unit interval.

For example, when a transmitter is running at 2.5 GHz (UI of 400 ps) and the receiving device is at 2.5015 GHz (UI of 399.76 ps), there is a 0.015 GHz offset in clock frequency (a 600 PPM error). As an illustrative example, a receiver having a phase interpolator with 32 steps per UI, (400 ps/32 steps=temporal granularity of 12.5 ps per step) has to step once every 52 UI to make up the 600 PPM difference. One step every 52 UI allows quite a bit of digital filtering to mitigate any jitter impacts.

In a case when spread spectrum clocking (SSC) is turned on, typically for electro-magnetic radiation concerns, the amount of PPM error is substantially increased. As an illustrative example, a typical PPM error in edge placement for SSC is +−2500 PPM. Therefore, having independent clock sources for the transmitter and receiver, such as in FIG. 1, may cause an edge placement 2500 PPM earlier than ideal placement at the transmitter and 2500 PPM later than ideal placement at the receiver. This would result in a 5000 PPM error between the transmitter and receiver.

Continuing the aforementioned example, a phase interpolator with 32 steps per UI would require one step every 6 UI, instead of every 52 UI, to make up for a 5000 PPM error. For serial interfaces the maximum UI between edges is typically defined to be every 5 to 7 UI; therefore, a requirement of one step every 6 UI would not allow for any digital filtering.

One possibility is to decrease the number of steps per unit interval. For example, from 32 steps per UI to 16 steps per UI, but this would have the effect of doubling the temporal granularity (400 ps/32 steps=12.5 ps and 400 ps/16 steps=25 ps) of the phase interpolator and doubling the worst-case error from the ideal sampling point.

Figure 3:
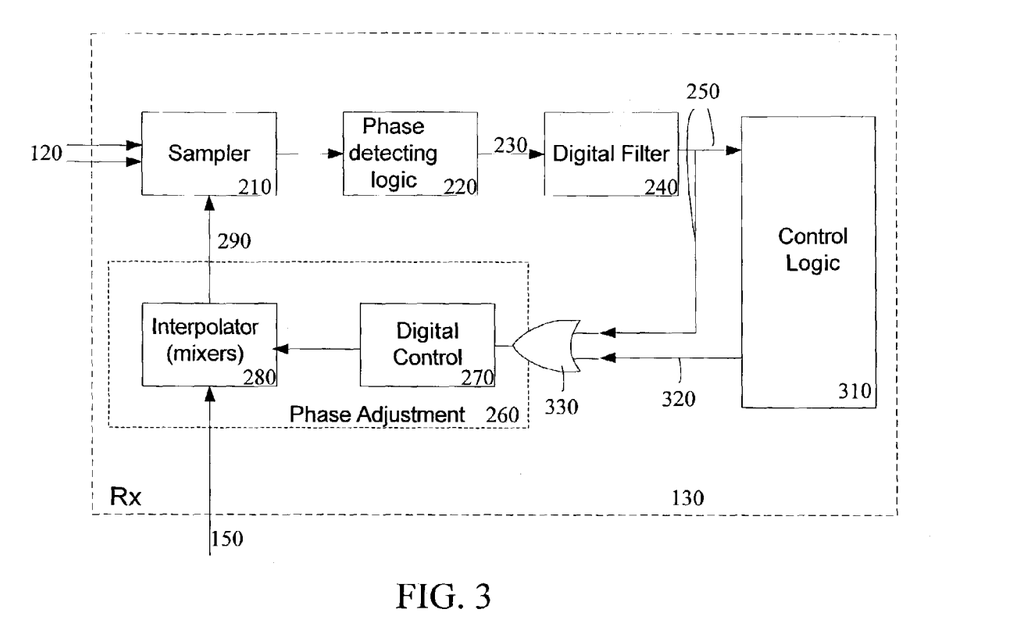
FIG. 3 illustrates a block diagram of control logic coupled to a phase interpolator.

FIG. 3 illustrates control logic 310 coupled to the loop to provide error signals to phase adjustment block 260 to trigger phase adjustment of sampler 210, while still allowing the loop to filter the incoming signal and maintain its temporal granularity. Control logic 310 is described in more detail when referring to FIG. 4. Control logic 310 is coupled to phase adjustment block 260 through comparator logic 330, which takes as inputs a first error signal 250 and a second error signal 320. In one embodiment comparator logic 330 is an OR gate. In an alternative embodiment, comparator logic 330 is a NOR gate with and inverter coupled to the NOR gate's output. It is apparent that control logic 310 may be coupled to the loop in numerous ways, including many other known logic gates.

Figure 4:
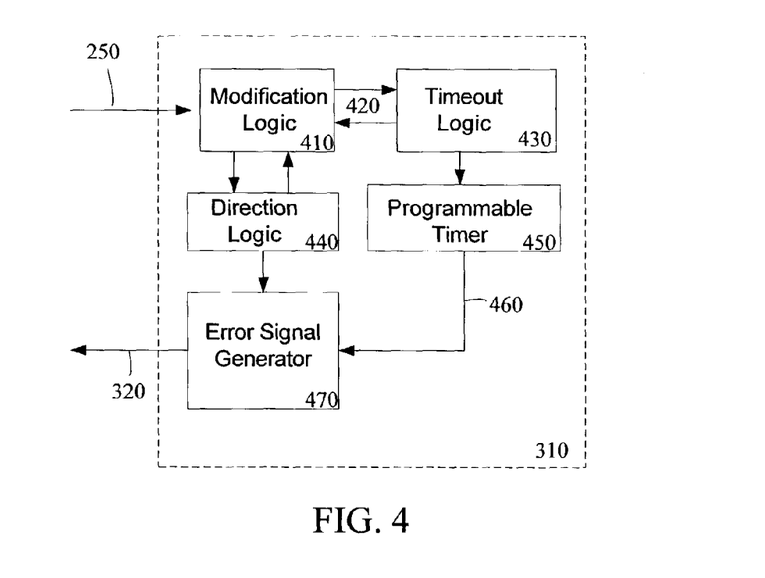
FIG. 4 illustrates a block diagram of the control logic shown in FIG. 3.
Figure 7:
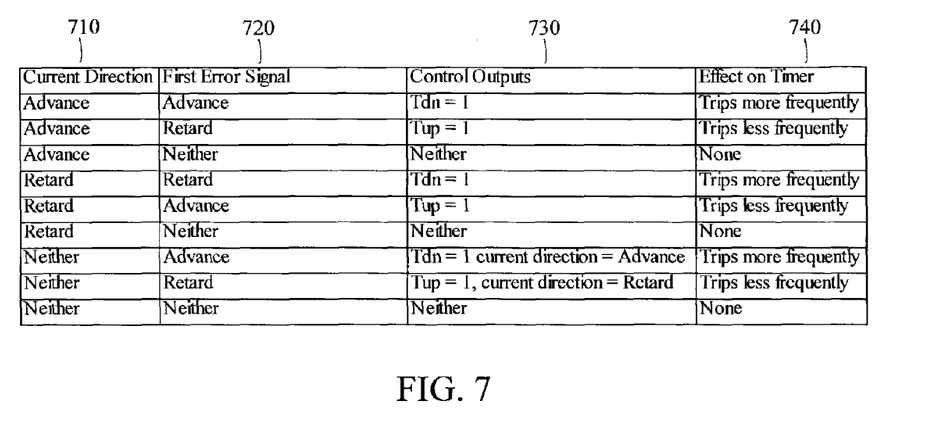
FIG. 7 illustrates an implementation of the modification logic shown in FIG. 4.

FIG. 4 depicts one embodiment of the control logic 310. In this embodiment modification logic 410 receives error signal 250. The modification logic 410 uses error signal 250 and the current direction stored in direction logic 440 to modify a timeout value in timeout logic 430. Timeout logic 430 may be implemented using ordinary gates and registers to store, change, and provide the timeout value. Current direction logic may also be implemented using ordinary gates and registers to store, change, and provide the current/new direction. One embodiment of the function performed by modification logic is detailed in FIG. 7. Ordinary gates and registers may be used to implement the modification logic 410 to obtain the results in FIG. 7. Column 710 represents the current direction stored in direction logic 440, column 720 represents a first error signal 250 (either an advance signal, retard signal, or neither (no change)), column 730 represents the output of the modification logic to decrement (Tdn=1) or increment (Tup=1) the timeout value in timeout logic 430 and also the change in the current direction 440, and column 740 represents the effect that increment or decrement of the timeout value has on programmable timer 450.

Programmable timer 450 uses the timeout value in timeout logic 430 to set the amount of time until timer 450 trips. As an illustrative example, the timeout value could have a value of 32. Programmable timer 450 may count up to 32 and trip, or programmable timer 450 may count down from 32 and trip. Programmable timer 450 may count once or a plurality of times every UI. When programmable timer 450 trips, it sends trip signal 460 to error signal generator 470, which looks at the new direction in the direction logic 440 and generates a second error signal 320 to pass to phase adjustment block 260. Timer 450 may be realized using an ordinary counting circuit that is programmable to count up to or down from different timer values.

Figure 8:
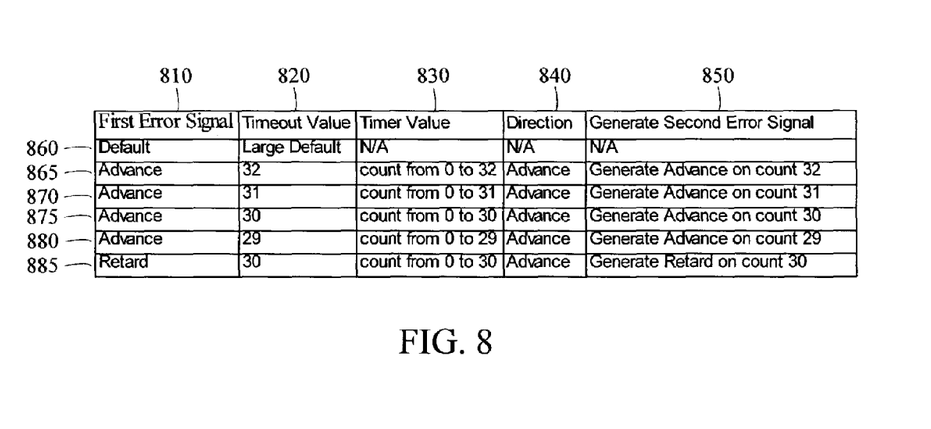
FIG. 8 illustrates examples of how the control logic in FIG. 3 operates.

FIG. 8 depicts an illustrative example of how control logic 310 functions. Column 810 represents a first error signal 250 (advance, retard, or neither), column 820 represents the timeout value stored in timeout logic 430, column 830 represents programmable timer 450's timer value, column 840 represents the new direction stored in direction logic 440, and column 850 represents when the second error signal 320 is generated. In row 865, the first error signal 250 represents an advance signal, so modification logic 410 decrements the timeout value stored in timeout logic 430 from the max default value to 32. Programmable timer 450's timer value is set to 32, the new direction stored in direction logic 440 is advance, and second error signal 320 is generated when programmable timer 440 trips on the thirty-second count. In row 885, first error signal 250 represents a retard signal, so the timeout value in timeout logic 430 is incremented from 29 (as set in row 880) to 30. Programmable timer 450's timer value is set to 30, the new direction in direction logic 470 stays at advance, and second error signal 320 is generated on the thirtieth count of timer 450. Once the timeout value returns to the default maximum value and an error signal is received in the opposite direction of the current stored direction, the current direction is then set to neither. The direction of the next error signal would determine the new stored direction. For example, if the current direction is neither, and a retard signal is received the current direction would be stored as retard.

In one embodiment of the control logic, the logic will lock and programmable timer 450 will trip at rate necessary to make up the PPM offset between the transmitter and the receiver. The period when the control logic is unlocked is typically referred to as an initialization period. The rate, as mentioned above, is described in the following equation:

$$\text{Rate} = \frac{1 + \frac{\text{PPM}_{Error}}{10e^6}}{\frac{\text{Steps} * \text{PPM}_{Error}}{10e^6}},$$

where $\text{PPM}_{Error}$ is the offset between clock rates of the transmitter and receiver in parts-per-million and Steps is the number of steps to cover the full unit interval. Therefore, within a system that has a 600 PPM offset and a temporal granularity of 12.5 ps, timer 450 will trip every 52 UI generating a second error signal 320 to trigger phase adjustment. Furthermore, within a system that has a 5000 PPM difference and a temporal granularity of 12.5 ps, timer 450 would trip every 6UI generating a second error signal to trigger phase adjustment every 6 UI, while digital filter 240 would still be able to filter the incoming signal jitter over 52 UI.

In one embodiment there are three conditions that should be met to ensure locking and stability of the architecture. The first condition is the minimum time between tripping programmable timer 450 should be fast enough so that the rate of programmable timer 450 is sufficient to track the PPM offset between the transmitter and the receiver. This may be met by setting the minimum timeout value to less than a calculated step size. For example, if a step is needed every 6UI and programmable timer 450 is counting once per UI, the minimum timeout value should be set to 5. This minimum setting of 5 would ensure that timer 450 could trip every 6 UI. Second, the timeout counter value adjustment rate should be quick enough to track any change in the PPM offset between the transmitting and receiving device. For example, in the SSC case the typical PPM difference varies from 0 to 5000 PPM at a 30 KHz rate, so the timeout value should be able to update within a 30 KHz time period.

Figure 5:
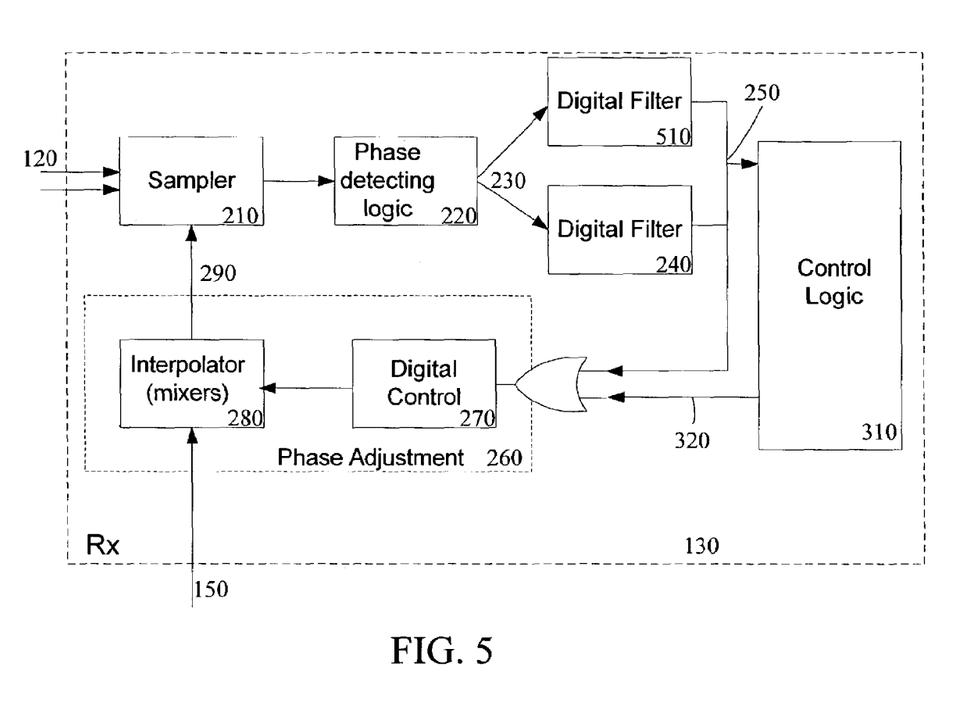
FIG. 5 illustrates an alternate embodiment of to a phase interpolator with two digital filters coupled to control logic.

Third, the timeout value and the step size should be designed so that the DRC is able to achieve lock from an unlocked condition. In one embodiment, shown in FIG. 5, Digital Filter 240 during initialization may be bypassed to allow a quick acquisition of the lock position. In FIG. 5, a second digital filter 510 is used to bypass digital filter 240. Digital filter 510 may have any depth including 0. At a depth of 0 all out-of-phase detection signals 230 would pass to the control logic. In another embodiment, uneven step sizes of the timeout value may be used. For example, instead of counting the timer value down from a max default value by one each time, uneven jumps may be used, such as the first step being from 32 to 25 (a step of 7), the second step to 20 (a step of 5), the third step to 17 (a step of 3), the fourth step to 15 (a step of 2), etc. In yet, another embodiment successive errors signals that all represent an advance or all represent a retard signal, may trigger a jump in the timeout value. For example, under normal operation the counter could decrement by one from 32 for every advance signal, but when 4 consecutive advance signals are received the timeout value could jump 5 values. It is apparent that one may use any combination of the aforementioned embodiments to ensure the architecture is able to achieve lock from an unlocked position.

Figure 9:
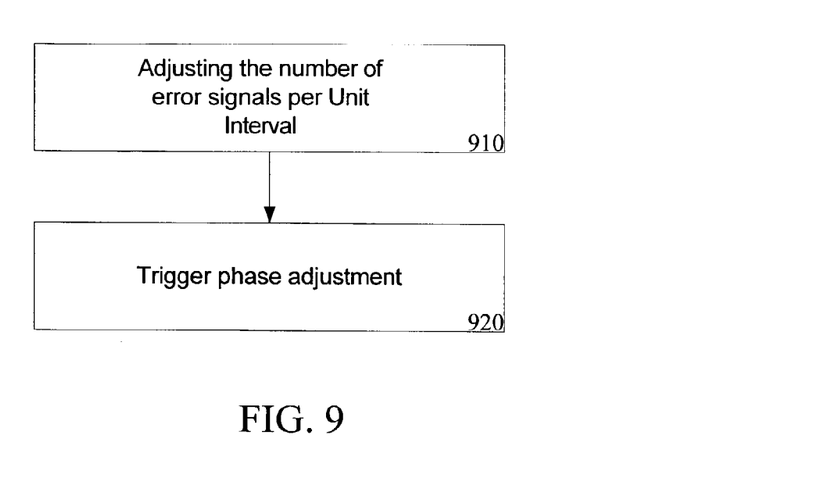
FIG. 9 illustrates a method for adjusting the number of error signals per Unit Interval that trigger phase adjustment.
Figure 10:
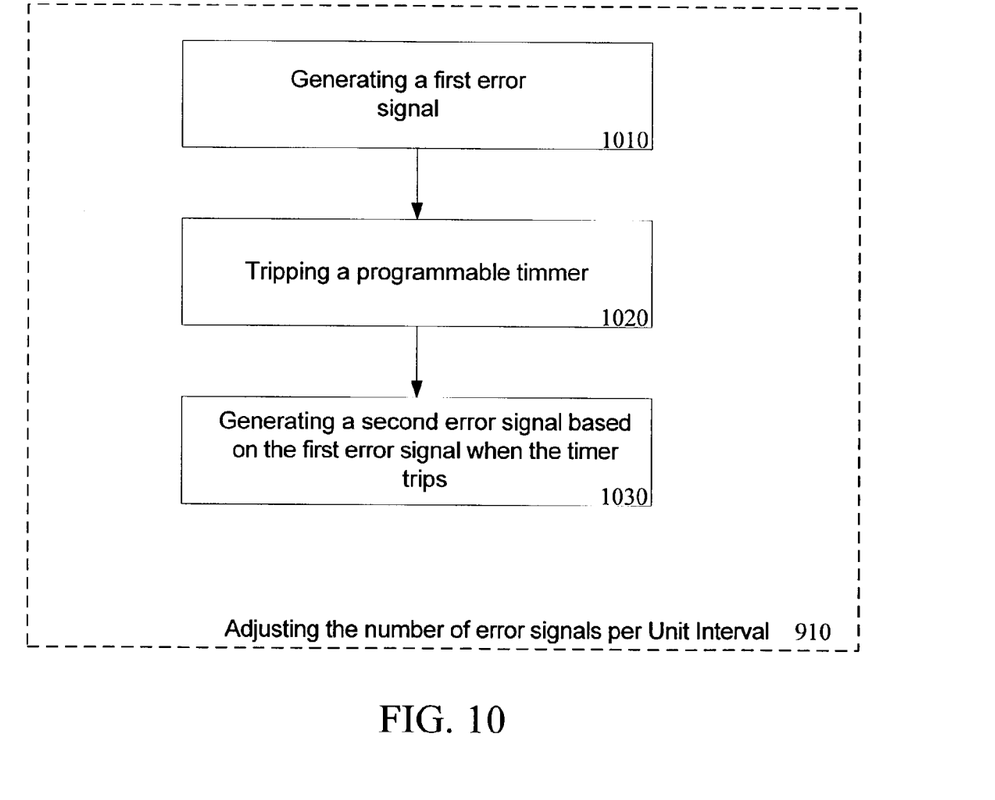
FIG. 10 illustrates an example of how the number of error signals per Unit Interval may be adjusted.
Figure 11:
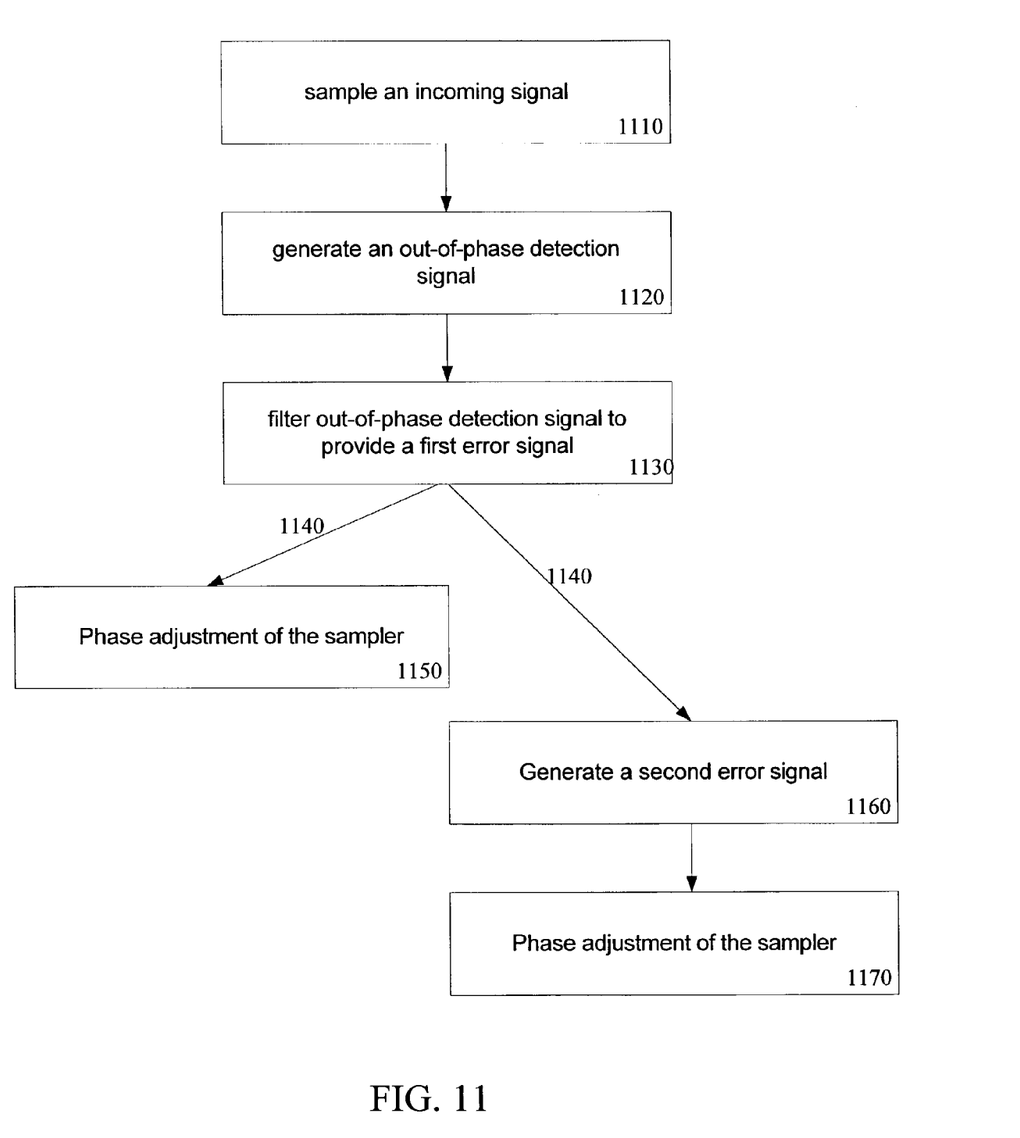
FIG. 11 illustrates a specific example of a method embodied in the hardware for adjusting the rate at which control logic adjusts the phase of sampler clocks within a loop.

The method embodied in the above hardware is depicted in FIGS. 9-11. Referring to FIG. 9, a method for adjusting the number of error signals in a data recovery circuit is illustrated. In block 910, the number of error signals per unit interval are adjusted, wherein each error signal in step 910 triggers phase adjustment in step 920.

FIG. 10 illustrates the method wherein one may adjust the number of error signals per unit interval in a data recovery circuit. To adjust the number of error signals per unit interval, a first error signal is generated in step 1010. In step 1020, a programmable timer is tripped, which, in step 1030, causes a second error signal to be generated based off the first error signal in step 1010.

FIG. 11 depicts another example of a method embodied in the hardware described above. In step 1110, an incoming signal is sampled. Based on that sample of the incoming signal an out-of-phase detection signal is generated in step 1120. In step 1130, the out-of-phase detection signal is filtered to provide a first error signal 1140 to trigger phase adjustment in step 1150. A second error signal is generated in step 1160 based on the first error signal 1140. As an illustrative example, step 1160 may be done by tripping a programmable timer, wherein the second error signal is generated based on the first error signal when the programmable timer trips.

Figure 6:
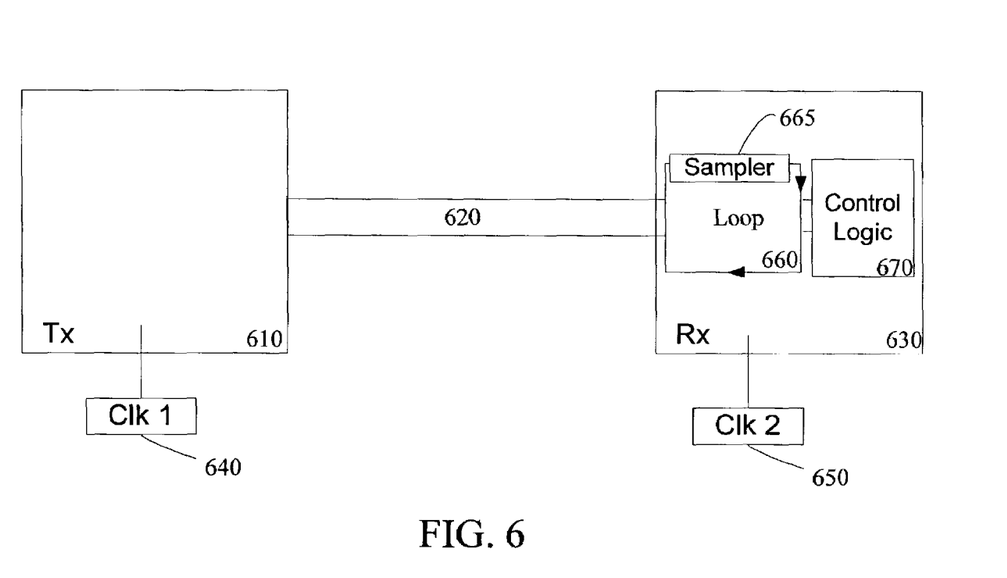
FIG. 6 illustrates a system with a transmitting device synchronized to one clock and a receiving device synchronized to another clock including a loop with a sampler coupled to control logic, wherein the transmitter and receiver are coupled together by an interconnect/bus.

Furthermore, a system, as depicted in FIG. 6, may comprise the data recovery circuit described above. FIG. 6 depicts a transmitter 610 to transmit data synchronized to a first clock 640 over an interconnect/bus 620. A receiving device 630 is coupled to interconnect/bus 620 and is synchronized to a second clock 650. In an alternate embodiment, first clock 640 and second clock 650 may be the same clock. The receiving device including a loop 660 to adjust the phase of sampler 665, which samples the transmitted data, and control logic 670 coupled to loop 660 to change the frequency at which the loop adjusts the phase of sampler 665. In one embodiment, the loop may be a phase interpolator. In another embodiment, the control logic may change the frequency at which the loop adjusts the phase of sampler 665 by increasing the frequency at which error signals are generated within the loop. It is apparent that one may adjust the phase of a plurality of sampling clocks to adjust the phase of sampler 665.

Thus as explained above, the use of control logic to change the rate at which a loop adjusts the phase of a sampling clock, allows one to keep the advantages of digital filtering and temporal granularity of phase adjustments, while being able to extend the current loop's tolerance for PPM offset.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A circuit comprising:
   sampling logic to sample an incoming signal,
   phase detection logic to determine a phase error associated with the sample of the incoming signal and to output an out-of-phase detection signal based on the phase error,
   control logic coupled to the phase detection logic to output a periodic error signal at a periodic rate; and
   phase adjustment logic to adjust the phase of the sampling logic based on the out-of-phase detection signal and the periodic error signal.

2. The circuit of claim 1, wherein the control logic comprises: a programmable timer to output the periodic error signal at the periodic rate.

3. The circuit of claim 2, wherein the control logic further comprises: modification logic to modify the periodic rate at which the programmable timer trips, wherein in response to the out-of-phase detection signal and a current direction of the programmable timer stored in the control logic, the modification logic is to modify a timeout value to be provided to the programmable timer and to provide a new direction of the programmable timer.

4. The circuit of claim 3, wherein the control logic further comprises: an error signal generator to output the periodic error signal when the programmable timer trips, based on the new direction.

5. The circuit of claim 4, wherein the control logic further comprises: direction logic to provide the current direction to the modification logic and to store the new direction.

6. The circuit of claim 5, wherein the control logic further comprises: timeout logic to store the timeout value.

7. The circuit of claim 6, wherein the programmable timer trips in response to counting down from the timeout value to zero.

8. The circuit of claim 7, wherein the timeout value has a predetermined maximum default value.

9. The circuit of claim 7, wherein the modification logic is to modify a timeout value to be provided to the timeout logic by stepping the timeout value stored in the timeout logic in even step sizes.

10. The circuit of claim 7, wherein the modification logic is to modify a timeout value to be provided to the timeout logic by stepping the timeout value stored in the timeout logic in uneven step sizes.

11. The circuit of claim 7, wherein the modification logic is to modify a timeout value to be provided to the timeout logic by stepping the timeout value stored in the timeout logic in uneven step sizes within a first range of the timeout value and in even step sizes within a second range of the timeout value.

12. The circuit of claim 1, wherein the control logic is coupled to the phase adjustment logic by a comparator logic.

13. The circuit of claim 12, wherein the comparator logic is an OR gate.

14. The circuit of claim 12, wherein the comparator logic is a NOR gate with an inverter coupled to the output of the NOR gate.

15. The circuit of claim 1, wherein the control logic, the phase adjustment logic, the phase detection logic, and the sampling logic are in a receiving agent to receive the incoming signal from a transmitting agent, wherein the control logic, when locked, outputs the periodic error signal at the periodic rate, the periodic rate being equal to $$\frac{1 + \frac{PPM_{Error}}{10e^6}}{\frac{Steps * PPM_{Error}}{10e^6}},$$

the $PPM_{Error}$ being an offset of a first clock rate associated with the transmitting agent and a second clock rate associated with the receiving agent in parts-per-million (PPM) and the Steps being a number of steps to cover a unit interval of the second clock rate.

16. The circuit of claim 1, wherein the sampling logic is to sample the incoming signal with clocks in quadrature to each other.

17. The circuit of claim 1, further comprising: a first digital filter with a first depth coupled to the phase detection logic, the digital filter to filter the out-of-phase detection signal and provide a filtered out-of-phase detection signal.

18. The circuit of claim 17, wherein the phase adjustment logic to adjust the phase of the sampling logic based on the out-of-phase detection signal and the periodic error signal comprises: adjusting the phase of the sampling logic based on the filtered out-of-phase detection signal and the periodic error signal.

19. The circuit of claim 18, wherein the phase adjustment logic runs at a slower frequency than the incoming signal.

20. The circuit of claim 18, wherein the out-of-phase detection signal represents an advance or a retard signal.

21. The circuit of claim 18, wherein the filtered out-of-phase detection signal represents an advance signal, a retard signal, or neither.

22. The circuit of claim 18, wherein the first digital filter is to provide the filtered out-of-phase detection signal during normal operation of the circuit, and wherein the circuit of claim 18 further comprises a second digital filter with a second depth to receive the out-of-phase detection signal and provide the filtered out-of-phase detection signal in response to the out-of-phase detection signal being generated during an initialization period of the circuit.

23. The circuit of claim 22, wherein the second depth of the second digital filter is less than the first depth of the first digital filter.

24. A circuit comprising
   a loop to adjust the phase of a sampler clock, which samples an incoming signal, wherein the loop includes a sampler to take a sample of the incoming signal based on the sampler clock, phase detecting logic to generate an out-of-phase detection signal based on the sample of the incoming signal, a digital filter to filter the out-of-phase detection signal and provide a first error signal, and phase adjustment logic to adjust the phase of the sampler clock based on the first and a second error signal; and control logic coupled to the loop to receive the first error signal from the digital filter and provide the second error signal to the phase adjustment logic.

25. The circuit of claim 24, wherein the control logic is coupled to the loop by a comparator logic that takes the first and second error signals as inputs and provides a comparator output to the phase adjustment logic, and wherein the comparator logic includes a gate selected from a group consisting of an AND gate, an OR gate, and a NOR gate.

26. A method comprising:
receiving an incoming signal with a receiving agent;
taking a sample of the incoming signal at a sampling rate;
generating a first signal, based on the sample of the incoming signal, to trigger a first phase adjustment of the sampling rate;
generating a second signal to trigger a second phase adjustment of the sampling rate based on a temporal granularity of the receiving agent.

27. The method of claim 26, wherein the receiving agent includes a phase interpolator.

28. The method of claim 26, wherein generating a second signal to trigger a second phase adjustment of the sampling rate based on a temporal granularity of the receiving agent comprises tripping a programmable timer at a periodic adjustment rate, which is based on the temporal granularity of the receiving agent, the second error signal to trigger the second phase adjustment of the sampling rate in response to tripping the programmable timer.

29. The method of claim 28, wherein the adjustment rate is faster than a first error signal rate that the first error signal is to be generated at.

30. The method of claim 29, wherein the adjustment rate is equal to $$\frac{1 + \frac{PPM_{Error}}{10e^6}}{\frac{Steps * PPM_{Error}}{10e^6}},$$

and wherein the $PPM_{Error}$ is an offset of a first frequency associated with the receiving agent and a second frequency associated with a transmitting agent to transmit the incoming signal in parts-per-million (PPM) and the Steps being a number of steps to cover a unit interval of the first frequency.

31. A method comprising:
sampling an incoming signal with a sampler;
generating an out-of-phase detection signal based on the sample of the incoming signal;
filtering the out-of-phase detection signal to provide a first error signal that triggers phase adjustment of the sampler; and generating a second error signal to trigger phase adjustment of the sampler based on the first error signal.

32. The method of claim 31, wherein generating a second error signal comprises:
tripping a programmable timer at a periodic adjustment rate based on a frequency offset of a transmitting agent to transmit the incoming signal and a receiving agent including the sampler; and
generating the second error signal in response to tripping the programmable timer.

33. A system comprising:
a transmitting device, to transmit data synchronized to a first clock;
a receiving device coupled to the transmitting device through a bus interface and synchronized to a second clock, the receiving device comprising a loop to adjust the phase of a sampler that samples the transmitted data and control logic coupled to the loop to periodically cause the loop to adjust the phase of the sampler based on an offset of the first clock and the second clock, wherein a periodic rate at which the control logic periodically causes the loop to adjust the phase of the sampler is a greater rate than a rate at which the loop adjusts the phase of the sampler based on samples of the transmitted data by the sampler.

34. The system of claim 33, wherein the loop includes the sampler, phase detection logic coupled to the sampler to detect a phase error in samples of the transmitted data, a digital filter coupled to the phase detection logic to filter the phase error, and phase adjustment logic coupled to the digital filter to adjust the phase of the sampler based on the phase error and the offset of the first clock and the second clock.

35. An apparatus comprising
a sampler to take a sample of an incoming signal based on a sampler clock,
phase detecting logic to generate an out-of-phase detection signal based on the sample of the incoming signal,
a digital filter to filter the out-of-phase detection signal and provide a first error signal, and
control logic coupled to the digital filter to receive the first error signal and provide a second error signal at a first rate; and
phase adjustment logic coupled to the digital filter and the control logic to adjust the phase of the sampler clock based on the first and the second error signals.

36. The apparatus of claim 35, wherein first rate is based on a temporal granularity associated with a receiving agent including the sampler, the digital filter, the control logic, and the phase adjustment logic.

37. The apparatus of claim 35, wherein a comparator logic coupled before the phase adjustment logic takes the first and second error signals as inputs and provides a comparator output to the phase adjustment logic, and wherein the comparator logic includes a gate selected from a group consisting of an AND gate, an OR gate, and a NOR gate.

* * * * *